United States Patent
Kim et al.

(10) Patent No.: US 7,556,910 B2
(45) Date of Patent: Jul. 7, 2009

(54) PHOTOSENSITIVE COMPOSITION COMPRISING TRIAZINE-BASED PHOTOACTIVE COMPOUND CONTAINING OXIME ESTER

(75) Inventors: Sung Hyun Kim, Daejeon (KR); Kyung Jun Kim, Daejeon (KR); Dong Chang Choi, Daejeon (KR); Jeong Ae Yoon, Masan-si (KR); Hee Kwan Park, Daejeon (KR); Geun Young Cha, Seoul (KR); Keon Woo Lee, Daejeon (KR); Il Eok Kwon, Seoul (KR); Dong Kung Oh, Daejeon (KR); Jong Hyun Park, Daejeon (KR); Xiang Li Li, Daejeon (KR); Han Soo Kim, Seoul (KR); Min Young Lim, Daejeon (KR); Chang Ho Cho, Daejeon (KR)

(73) Assignee: LF Chem, Ltd., Seoul (KR)

( * ) Notice: Subject to any disclaimer, the term of this patent is extended or adjusted under 35 U.S.C. 154(b) by 394 days.

(21) Appl. No.: 11/605,329

(22) Filed: Nov. 29, 2006

(65) Prior Publication Data

US 2007/0128548 A1 Jun. 7, 2007

(30) Foreign Application Priority Data

Dec. 1, 2005 (KR) .................. 10-2005-0116609
Dec. 30, 2005 (KR) .................. 10-2005-0134925

(51) Int. Cl.
*G03F 7/00* (2006.01)
*G03F 7/004* (2006.01)
*C07D 251/24* (2006.01)

(52) U.S. Cl. ............... 430/270.1; 430/281.1; 430/905; 430/913; 544/180; 544/193; 544/216

(58) Field of Classification Search ............ 430/270.1, 430/905, 913, 281.1; 544/180, 193, 216
See application file for complete search history.

(56) References Cited

U.S. PATENT DOCUMENTS

| 4,202,697 | A | 5/1980 | Van Goethem et al. |
| 5,837,420 | A | 11/1998 | Aoai et al. |
| 6,001,517 | A | 12/1999 | Kawamonzen |
| 6,512,020 | B1 | 1/2003 | Asakura et al. |
| 6,613,495 | B2 * | 9/2003 | Shelnut .................. 430/280.1 |
| 6,645,692 | B2 * | 11/2003 | Namba .................. 430/270.1 |
| 2006/0063101 | A1 * | 3/2006 | Baumann et al. .......... 430/270.1 |

FOREIGN PATENT DOCUMENTS

| DE | 199 28 742 A1 | 12/1999 |
| JP | 53-133428 | 11/1978 |
| KR | 10-20020087658 A | 11/2002 |
| WO | WO 00/52530 | 9/2000 |
| WO | WO 02/25376 A2 | 3/2002 |
| WO | WO 02/100903 A1 | 12/2002 |
| WO | WO 2004/074242 A2 | 9/2004 |

* cited by examiner

*Primary Examiner*—Amanda C. Walke
(74) *Attorney, Agent, or Firm*—McKenna Long Aldridge LLP

(57) ABSTRACT

The present invention relates to a photosensitive composition comprising a triazine-based photoactive compound containing oxime ester. The photosensitive composition according to the present invention has good sensitivity, retention rate, mechanical strength, heat resistance, chemical resistance and developing durability since it contains, as photopolymerization initiator, a compound having an oxime ester group and a triazine group in one molecule and thus effectively absorbs UV radiation. Therefore, the photosensitive composition according to the present invention is advantageous not only in curing of materials for color filters, resin black matrixes, column spacers, overcoats and passivation films of liquid crystal displays, but also in high temperature process characteristics.

14 Claims, No Drawings

PHOTOSENSITIVE COMPOSITION COMPRISING TRIAZINE-BASED PHOTOACTIVE COMPOUND CONTAINING OXIME ESTER

This application claims the benefit of Korean Patent Application No. 10-2005-0116609, filed in Dec. 1, 2005 and Korean Patent Application No. 10-2005-0134925, filed on Dec. 30, 2005, which are hereby incorporated by reference for all purposes as if fully set forth herein.

TECHNICAL FIELD

The present invention relates to a photosensitive composition comprising a triazine-based photoactive compound containing oxime ester.

The present application claims the benefit of Korean Patent Application No. 2005-0116609 (filed on Dec. 01, 2005) and No. 2005-0134925 (filed on Dec. 30, 2005), which are incorporated herein by its entirety for reference.

BACKGROUND ART

A photosensitive composition can be applied onto a substrate to form a coating film, the whole coating film is subjected to light exposure to form an insulating film or protective film, or a specific portion of the coating film is subjected to exposure by light irradiation using a photomask and then a non-exposure portion is subjected to a development treatment to remove it, thereby forming a pattern. This photosensitive composition have been used for photocurable inks, photosensitive printing plates, various photoresists, color filter photoresists for LCDs, photoresists for resin black matrixes, transparent photosensitive materials and the like since the photosensitive composition can be polymerized and cured by light irradiation.

Among photosensitive compositions, a transparent photosensitive composition is used in column spacers, overcoats and passivation films and usually contains an alkali-soluble resin binder, a polymerizable compound having an ethylenically unsaturated bond, a photopolymerization initiator and a solvent, but is not used in combination with a coloring aid such as a pigment.

A colored photosensitive composition is used in color filter photoresists and photoresists for resin black matrixes and usually contains red, green, blue and black colorants, an alkali-soluble resin binder, a polymerizable compound having an ethylenically unsaturated bond, a photopolymerization initiator and a solvent In order to meet the demand for high quality and diversification of LCD applications, LCDs have been fabricated as applications for liquid crystal display device such as televisions and monitors, in addition to applications for conventional laptop and mobiles etc. For the purpose of improvement in productivity and durability, materials having high light-sensitivity and excellent mechanical properties have been demanded. When patterns are formed by photolithography or insulating protective films are formed by the whole exposure, high light-sensitive property, that is, photosensitivity is a factor playing a very important role. Further, for preventing the liquid display device from being broken by external impact and exhibiting its inherent performance, column spacers having a function as a support, and overcoats and passivation films having a function as protective films have to have excellent mechanical properties. Therefore, when a photopolymerization initiator having excellent photosensitivity is used, the above problems can be rapidly and preferably solved. When the photopolymerization initiator having excellent photosensitivity is used, it is advantageous in that sufficient sensitivity can be realized even when using a small amount of the photopolymerization initiator, and therefore it is possible to reduce the pollution sources of liquid crystal, improve the retention rate of the pattern and increase the usable amount of other raw materials in the production of a composition.

Further, in the case of a colored photosensitive composition, an extremely fine dispersion of the pigment has been carried out for the improvement in contrast or transmittance. In the case of a black matrix, high optical density (OD) values are required for improving the illuminance of backlight and hence the content of a black colorant is increased in the photosensitive composition. When the concentration of the colorant is increased, the amount of light transmitted to the lower portion of a film is suddenly decreased and thus through cure is lowered and the problem such as the delamination of a pattern and insufficient line width is occurred. Further, since the extremely fine dispersion of the pigment results in the expansion of the surface area thereof in the photosensitive composition and the amount of the photopolymerization initiator adsorbed onto the surface of the pigment is increased, there is a problem that an excess of the photopolymerization initiator is used for exhibiting sufficient sensitivity.

In order to solve these problems, the use of a photopolymerization initiator having excellent sensitivity is strongly demanded. In particular, if sufficient sensitivity is realized even when using a small amount of the photopolymerization initiator, it is possible to reduce the pollution sources of liquid crystal, improve the retention rate of the pattern and increase the usable amount of other raw materials in the production of a composition.

The known various types of photopolymerization initiators used in these photosensitive compositions include acetophenone derivatives, benzophenone derivatives, biimidazole derivatives, acylphosphine oxide derivatives, triazine derivatives and oxime derivatives.

Among them, the most typical commercially available photopolymerization initiators are acetophenone derivatives. The acetophenone derivatives have good color property and solubility, and are relatively inexpensive. In particular, since Irgacure 369 and Irgacure 907 available from Ciba Specialty Chemicals have excellent sensitivity, they are widely used in the applications of the colored photosensitive composition. However, since they should be used in an amount of 3% or more, even 10% or more of the solid content to exhibit sufficient sensitivity, they may tend to lower the retention rate and may be a cause of the pollution of liquid crystal. Further, a composition having a high concentration of a pigment, particularly since a black photosensitive composition has low sensitivity, severe delamination of a pattern occurs in the case of using it alone.

As other commercially available photopolymerization initiators, halomethyl triazine compounds that are decomposed by light irradiation to generate halogen radicals are frequently used. Particularly, the sensitivities of 2-aryl-4,6-bis(trihalomethyl)-s-triazine are known to be relatively excellent.

For example, JP-A No. 53-133428 describes the use of a compound having a bicyclic or polycyclic aromatic group or heterocyclic aromatic group, as an aryl group at the 2-position thereof. Particularly preferably a naphthyl group, leads to good results. The triazine-based compound has unsatisfactory sensitivity in the practical applications and has disadvantages in that the stability with time of a photosensitive composition is lowered due to its use in large quantities or long-term light irradiation, as well as insufficient solubility into a polymerizable compound having ethylenically unsaturated bonds.

The oxime derivatives have advantages that are almost never in color, and have high permeability, high radical-generating efficiency by UV irradiation, and excellent stability and compatibility in the composition, and thus have been extensively studied.

WO 00/52530 and German Patent Application Laid-Open No. 199 28 742 A1 describe a photosensitive composition using oxime ether, oxime ester, and particularly oxime sulfonate as a photoinitiator.

WO 02/100903 A1 describes an oxime ester compound having a structure bonded with alkyl acyl ketone, diaryl ketone or ketocoumarin.

In addition to these compounds, U.S. Pat. No. 4,202,697 describes an etch resist having an oxime ester structure and U.S. Pat. No. 6,001,517 describes a positive photosensitive composition comprising an oxime ester structure as a photosensitive cure accelerator.

However, among the oxime derivative compounds used as above, the initially developed compounds have low photoinitiation efficiency and do not effective for UV-light absorption in the case of having good color properties. The oxime derivative compounds published since the latter half of the 1990s have very good improved photoinitiation efficiency, but do not sufficiently satisfy the processing time conditions that were recently tightened.

In recent years, the commercially available oxime ester photopolymerization initiators, Irgacure OXE 01 and Irgacure OXE 02 (available from Ciba Specialty Chemicals) have considerably improved sensitivities and thus are being focused as the applications of colored photosensitive composition. However, since these photopolymerization initiators are very expensive, they cannot be used so as to exhibit sufficient sensitivity in terms of economy, and storage stability of the photopolymerization initiator itself is lowered.

Therefore, it has been desired the development of a photopolymerization initiator that is capable of overcoming the disadvantages of the above-mentioned photopolymerization initiators, and effectively absorbing UV radiation even when using a small amount thereof, and has excellent sensitivity and excellent high temperature process characteristics.

DISCLOSURE

[Technical Problem]

In this regard, the present inventors have investigated an inexpensive photopolymerization initiator having excellent sensitivity and storage stability and have found that a photosensitive composition containing, as photopolymerization initiator, a compound having a specific structure of introducing both an oxime ester group and a triazine group in one molecule, is capable of effectively absorbing UV radiation and has excellent sensitivity and excellent high temperature process characteristics, and thus have completed the present invention.

[Technical Solution]

It is an object of the present invention to provide a photosensitive composition comprising a triazine-based photoactive compound containing oxime ester.

[Advantageous Effects]

The photosensitive composition according to the present invention has sensitivity, retention rate, mechanical strength, heat resistance, chemical resistance and developing durability since it is contains, as photopolymerization initiator, a compound having an oxime ester group and a triazine group in one molecule and thus effectively absorbs UV radiation.

Therefore, the photosensitive composition according to the present invention is advantageous not only in curing of materials for color filters, resin black matrixes, column spacers, overcoats and passivation films of liquid crystal displays, but also in high temperature process characteristics.

[Best Mode]

The present invention provides a photosensitive composition comprising:

a) a triazine-based photoactive compound containing oxime ester represented by the following formula (1);

b) a polymerizable compound having an ethylenically unsaturated bond, c) an alkali-soluble resin binder; and d) a solvent.

Further, the present invention provides a colored photosensitive composition further comprising e) a colorant.

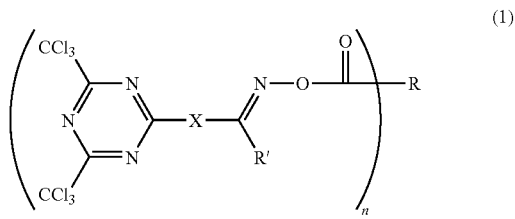

wherein n is an integer of 1 or 2;

when n=1, R is selected from the group consisting of a $C_1$ to $C_6$ alkyl group, a $C_1$ to $C_6$ haloalkyl group, a $C_1$ to $C_6$ alkyl group substituted with at least one group selected from the group consisting of $NL_2$, OL and SL wherein L is a hydrogen atom or $C_1$ to $C_6$ alkyl group, a phenyl group unsubstituted or substituted with at least one group selected from the group consisting of a $C_1$ to $C_6$ alkyl group, a halogen atom, a nitrile group, OH and COOH, and a $C_2$ to $C_5$ alkylcarboxyl group;

when n=2, R is selected from the group consisting of a $C_2$ to $C_6$ alkylene group, a 1,2-phenylene group, a 1,3-phenylene group, 1,4-phenylene group,

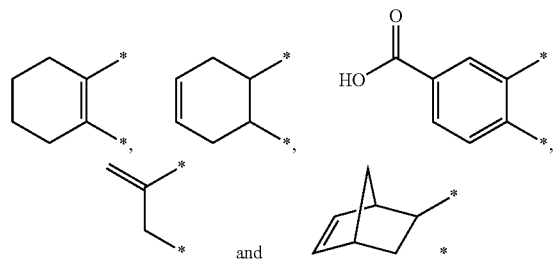

(* is a linking moiety);

R' is selected from the group consisting of a hydrogen atom, a $C_1$ to $C_6$ alkyl group, a nitrile group and a phenyl group;

X is a $C_5$ to $C_{20}$ arylene group unsubstituted or substituted with at least one group selected from the group consisting of a halogen atom, CN, a $C_1$ to $C_6$ alkyl group, a $C_1$ to $C_6$ alkoxy group, a $C_1$ to $C_6$ alkylthio group and a morpholino group; a divalent $C_4$ to $C_{20}$ heterocyclic group containing O, N or S, unsubstituted or substituted with at least one group selected from the group consisting of a halogen atom, CN, a $C_1$ to $C_6$ alkyl group, a $C_1$ to $C_6$ alkoxy group, a $C_1$ to $C_6$ alkylthio group and a morpholino group; or a compound of the following formula (2):

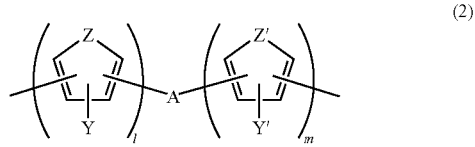

(2)

wherein Z and Z' are each independently one selected from the group consisting of $CH_2$, O, S, NR" wherein R" is a hydrogen atom or $C_1$ to $C_6$ alkyl group, and CH=CH;

l and m are an integer of 0 to 2, provided that l+m is not 0;

A is a simple linkage, or one selected from the group consisting of $C_pH_{2p}$, $O(CH_2O)_p$, CH=CH, NR''', S, O, S=O, $SO_2$, and C=O wherein p is an integer of 1 to 6 and R''' is a hydrogen atom or $C_1$ to $C_6$ alkyl group, provided that A is not a simple linkage when l+m=1; and Y and Y' are each optionally selected from the group consisting of a hydrogen atom, a halogen atom, CN, a $C_1$ to $C_6$ alkyl group, a $C_1$ to $C_6$ alkoxy group, a $C_1$ to $C_6$ alkylthio group and a morpholino group.

Preferably in the formula (1), when n=1, R is a methyl group or a phenyl group;

when n=2, R is an ethylene group or a tetrahydrophthalene group;

R' is a hydrogen atom, a methyl group or a phenyl group; and

X is selected from the group consisting of a phenylene group, a biphenylene group, a styrylene group and the following structural formulae:

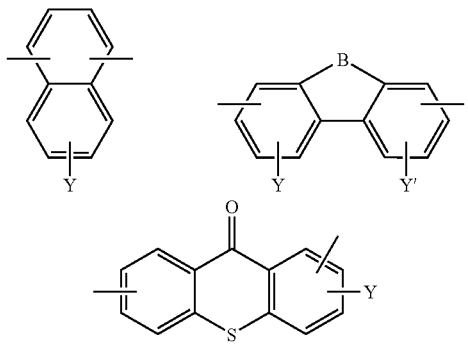

wherein B is one selected from the group consisting of $CH_2$, O, S, NR" wherein R" is a hydrogen atom or $C_1$ to $C_6$ alkyl group, and CH=CH; and Y and Y' are each optionally selected from the group consisting of a hydrogen atom, a halogen atom, CN, a $C_1$ to $C_6$ alkyl group, a $C_1$ to $C_6$ alkoxy group, a $C_1$ to $C_6$ alkylthio group and a morpholino group.

More preferably, in the formula (1), X is a phenylene group, a biphenylene group or a styrylene group.

In the formula (1), R is a moiety decomposed into radicals as active species upon exposure and is not particularly structurally limited, but the simpler structure the more movable, thereby improving photoinitiation efficiency.

X has to have a structure capable of absorbing UV radiation, particularly light in the 260 nm to 440 nm region, but is not particularly limited as long as it can have absorbance function. X is particularly preferably an aromatic group because of characteristics of the absorption wavelength band.

Hereinafter, the components of the photosensitive composition according to the present invention are described in detail.

In the photosensitive composition according to the present invention, nonrestrictive examples of the b) polymerizable compound having an ethylenically unsaturated bond include at least one compound selected from the group consisting of compounds obtained by esterifying α,β-unsaturated carboxylic acid with polyhydric alcohols such as ethylene glycol di(meth)acrylate, polyethylene glycol di(meth)acrylate having 2 to 14 ethylene groups, trimethylolpropane di(meth)acrylate, trimethylolpropane tri(meth)acrytate, pentaerythritol tri(meth)acrylate, pentaerythritol tetra(meth)acrylate, 2-trisacryloyloxy methylethyl phthalic acid, propylene glycol di(meth)acrylate having 2 to 14 propylene groups, dipentaerythritol penta(meth)acrylate, dipentaerythritol hexa(meth)acrylate and a mixture (trade name: TO-2348 and TO-2349, commercially available from Toagosei Co., Ltd.) of an acid modified product of dipentaerythritol penta(meth)acrylate and dipentaerythritol hexa(meth)acrylate; compounds obtained by adding (meth)acrylic acid to compounds containing glycidyl groups such as acrylic acid adducts of trimethylolpropane triglycidylether and bisphenol A diglycidylether; ester compounds or polyisocyanate adducts of polyfunctional carboxylic acids and the compounds having hydroxyl groups or phthalic acid diester of β-hydroxyethyl (meth)acrylate and toluene diisocyanate adducts of β-hydroxyethyl(meth)acrylate; alkylester of (meth)acrylic acid such as methyl (meth)acrylate, ethyl(meth)acyate, butyl (meth)acrylate and 2-ethylhexyl (meth)acrylate; and 9, 9'-bis [4-(2-acryloyloxyethoxy)phenyl]fluorene, but include ones known in the art without limitations. Further, if necessary, these compounds may contain a silica dispersion (for example, Nanocryl XP series (0596, 1045, 21/1364) and Nanopox XP series (0516, 0525), commercially available from Hanse Chemie GmbH).

In the photosensitive composition according to the present invention, the c) alkali-soluble resin binder may be a copolymer of a monomer containing an acid functional group and a monomer copolymerizable therewith for providing film strength, or a compound prepared by subjecting the copolymer to a polymer reaction with an ethylenically unsaturated compound containing an epoxy group.

The alkali-soluble resin binder used in the present invention is a binder having an acid number of about 30 to 300 KOH mg/g and a weight-average molecular weight in the range of preferably 1,000 to 200,000, more preferably 5,000 to 100,000.

Nonrestrictive examples of the monomer containing an acid functional group include (meth)acrylic acid, crotonic acid, itaconic acid, maleic acid, fumaric acid, monomethylmaleic acid, isoprenesulfonic acid, styrenesulfonic acid, 5-norbornene-2-carboxylic acid, mono-2-((meth)acryloyloxy)ethyl phthalate, mono-2-((meth)acryloyloxy)ethyl succinate, ω-carboxy polycaprolactone mono(meth)acrylate and mixtures thereof.

Nonrestrictive examples of the monomer copolymerizable with the monomer containing an acid functional group include unsaturated carboxylic acid esters such as benzyl (meth)acrylate, methyl(meth)acrylate, ethyl(meth)acrylate, butyl (meth)acrylate, dimethylaminoethyl(meth)acrylate, isobutyl(meth)acrylate, t-butyl(meth)acrylate, cyclohexyl (meth)acrylate, isobornyl(meth)acrylate, ethylhexyl(meth)acrylate, 2-phenoxyethyl(meth)acrylate, tetrahydrofurfuryl (meth)acrylate, hydroxyethyl(meth)acrylate, 2-hydroxypropyl(meth)acrylate, 2-hydroxy-3-chloropropyl (meth)acrylate, 4-hydroxybutyl(meth)acrylate, acyloctyloxy-2-hydroxypropyl(meth)acrylate, glycerol(meth)acrylate, 2-methoxyethyl(meth)acrylate, 3-methoxybutyl(meth) acrylate, ethoxydiethylene glycol(meth)acrylate, methoxytriethylene glycol(meth)acrylate, methoxytripropylene glycol(meth)acrylate, poly(ethylene glycol)methyl ether (meth)acrylate, phenoxydiethylene glycol(meth)acrylate, p-nonylphenoxypolyethylene glycol(meth)acrylate, p-nonylphenoxypolypropylene glycol(meth)acrylate, tetrafluoropropyl(meth)acrylate, 1,1,1,3,3,3-hexafluoroisopropyl (meth)acrylate, octafluoropentyl(meth)acrylate, heptadecafluorodecyl(meth)acrylate, tribromophenyl(meth) acrylate, methyl-α-hydroxymethyl acrylate, ethyl-α-hydroxymethyl acrylate, propyl-α-hydroxymethyl acrylate, butyl-α-hydroxymethyl acrylate, dicyclopentanyl(meth) acrylate, dicyclopentenyl(meth)acrylate, dicyclopentanyloxyethyl(meth)acrylate and dicyclopentenyloxyethyl(meth) acrylate; aromatic vinyls such as styrene, α-methylstyrene, (o,m,p)-vinyl toluene, (o,m,p)-methoxy styrene and (o,m,p)-chlorostyrene; unsaturated ethers such as vinyl methyl ether, vinyl ethyl ether and allyl glycidyl ether; N-vinyl tertiary amines such as N-vinyl pyrrolidone, N-vinyl carbazole and N-vinyl morpholine; unsaturated imides such as N-phenylmaleimide, N-(4-chlorophenyl)maleimide, N-(4-hydroxyphenyl)maleimide and N-cyclohexylmaleimide; maleic anhydrides such as maleic anhydride and methyl maleic anhydride; unsaturated glycidyl compounds such as allyl glycidyl ether, glycidyl(meth)acrylate, 3,4-epoxycyclohexylmethyl(meth)acrylate and mixtures thereof.

Examples of the ethylenically unsaturated compound containing an epoxy group include at least one compound selected from the group consisting of allyl glycidyl ether, glycidyl(meth)acrylate, 3,4-epoxycyclohexylmethyl(meth) acrylate, glycidyl 5-norbornene-2-methyl-2-carboxylate (mixture of endo and exo-isomers), 1,2-epoxy-5-hexene, and 1,2-epoxy-9-decene.

In the photosensitive composition according to the present invention, nonrestrictive examples of the d) solvent include at least one compound selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methylethyl ether, 2-ethoxypropanol, 2-methoxypropanol, 3-methoxybutanol, cyclohexanone, cyclopentanone, propylene glycol methyl ether acetate, propylene glycol ethyl ether acetate, 3-methoxybutyl acetate, ethyl-3-ethoxypropionate, ethyl cellosolve acetate, methyl cellosolve acetate, butyl acetate and dipropylene glycol monomethyl ether.

In the colored photosensitive composition according to the present invention, the e) colorant used may be at least one pigment, paint, or mixtures thereof. Specifically, examples of a black pigment include a metal oxide such as carbon black, graphite and titanium black. Examples of carbon black include SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (commercially available from Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (commercially available from Mitsubishi Chemical Corporation); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (commercially available from Degussa Japan Company); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, RAVEN-1170 (commercially available from Columbia Carbon Co.) and mixtures thereof.

Examples of a colored colorant include Carmine 6B (C.I. 12490), Phthalocyanine Green (C.I. 74260), Phthalocyanine Blue (C.I. 74160), Perylene Black (BASF K0084 and K0086), Cyanine Black, Lionol Yellow (C.I. 21090), Lionol Yellow GRO (C.I. 21090), Benzidine Yellow 4T-564D (C.I. 21095), Victoria Pure Blue (C.I. 42595), C.I. Pigment Red 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, 272; C.I. Pigment Green 7, 36; C.I. Pigment Blue 15:1, 15:3, 15:4, 15:6, 16, 22, 28, 36, 60, 64; C.I. Pigment Yellow 13, 14, 35, 53, 83, 93, 95, 110, 120, 138, 139, 150, 151, 154, 175, 180, 181, 185, 194, 213; and C.I. Pigment Violet 15, 19, 23, 29, 32, 37. In addition thereto, a white pigment and a fluorescent pigment can be also used.

The photosensitive composition according to the present invention may further contain, in addition to the above-mentioned components, at least one additive such as a second photoactive compound, a curing accelerator, a thermal polymerization inhibitor, a plasticizer, an adhesion accelerator, a filler and a surfactant.

Nonrestrictive examples of the second photoactive compound include a triazine-based compound such as 2,4-trichloromethyl-(4'-methoxyphenyl)-6-triazine, 2,4-trichloromethyl-(4'-methoxystyryl)-6-triazine, 2,4-trichloromethyl-(piperonyl)-6-triazine 2,4-trichloromethyl-(3',4'-dimethoxyphenyl)-6-triazine, 3-{4-[2,4-bis(trichloromethyl)-s-triazin-6-yl]phenylthio}propanoic acid, 2,4-trichloromethyl-(4'-ethylbiphenyl)-6-triazine and 2,4-trichloromethyl-(4'-methylbiphenyl)-6-triazine; a biimidazole compound such as 2,2'-bis(2-chlorophenyl)-4,4',5,5'-tetraphenylbiimidazole, and 2,2'-bis(2,3-dichlorophenyl)-4,4'5,5'-tetraphenylbiimidazole; an acetophenone-based compound such as 2-hydroxy-2-methyl-1-phenylpropan-1-one, 1-(4-isopropylphenyl)-2-hydroxy-2-methylpropan-1-one, 4-(2-hydroxyethoxy)-phenyl(2-hydroxy)propyl ketone, 1-hydroxycyclohexyl phenyl ketone, 2,2-dimethoxy-2-phenylacetophenone, 2-methyl-(4-methylthiophenyl)-2-morpholino-1-propan-1-one (Irgacure-907) and 2-benzyl-2-dimethylamino-1-(4-morpholinophenyl)-butan-1-one (Irgacure-369); an O-acyloxime-based compound such as Irgacure OXE 01 and Irgacure OXE 02 (commercially available from Ciba-Geigy Corporation); a benzophenone-based compound such as 4,4'-bis(dimethylamino)benzophenone and 4,4'-bis (diethylamino)benzophenone; a thioxanthone-based compound such as 2,4-diethyl thioxanthone, 2-chlorothioxanthone, isopropylthioxanthone and diisopropylthioxanthone; a phosphine oxide-based compound such as 2,4,6-trimethylbenzoyl diphenylphosphine oxide, bis(2,6-dimethoxybenzoyl)-2,4,4-trimethylpentylphosphine oxide and bis(2,6-dichlorobenzoyl)propylphosphine oxide; and a coumarin-based compound 3,3'-carbornylvinyl-7-(diethylamino) coumarin, 3-(2-benzothiazolyl)-7-(diethylamino)coumarin, 3-benzoyl-7-(diethylamino)coumarin, 3-benzoyl-7-methoxy-coumarin and 10,10'-carbornylbis[1,1,7,7-tetramethyl-2,3,6,7-tetrahydro-1H,5H,11H-C1]-benzopyrano[6,7,8-ij]-quinolizin-11-one.

Examples of the curing accelerator include at least one compound selected from the group consisting of 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate) and trimethylolethane tris(3-mercaptopropionate), but are not limited thereto and may include ones known in the art.

Examples of the thermal polymerization inhibitor include at least one compound selected from the group consisting of p-anisole, hydroquinone, pyrocatechol, t-butyl catechol, N-nitrosophenylhydroxyamineammonium salt, N-nitrosophenylhydroxyamine aluminum salt and phenothiazine, but are not limited thereto and may include ones known in the art.

As the plasticizer, the adhesion accelerator, the filler or the surfactant, any compounds that may be contained in the conventional photosensitive compound may be used.

The photosensitive composition according to the present invention can be applied on supporting materials such as metal, paper and a glass plastic substrate by using a roll coater, a curtain coater, a spin coater, slot die coater, various printings and dipping, and can be transferred to other supporting materials such as film after coating on the supporting materials, can be transferred to a blanket, etc and again transferred to the second supporting material after coating on the first supporting material. That is, there are no limits in the application methods.

Light sources for curing the photosensitive composition according to the present invention include, for example, a mercury vapor arc, a carbon arc and a xenon (Xe) arc, which emit light having wavelengths of 250 to 450 nm.

The transparent photosensitive composition according to the present invention preferably comprises:

a) 0.1 to 5 parts by weight of a triazine-based photoactive compound containing oxime ester represented by the formula (1);

b) 0.5 to 20 parts by weight of a polymerizable compound having an ethylenically unsaturated bond;

c) 1 to 20 parts by weight of an alkali-soluble resin binder; and d) 10 to 95 parts by weight of a solvent.

Further, when components other than the above-mentioned ones are added, it is preferred that the second photoactive compound is contained in the amount of 0.1 to 5 parts by weight and the other additives are contained in the amount of 0.01 to 5 parts by weight, respectively.

The colored photosensitive composition according to the present invention preferably comprises:

a) 0.1 to 5 parts by weight of a triazine-based photoactive compound containing oxime ester represented by the formula (1);

b) 0.5 to 20 parts by weight of a polymerizable compound having an ethylenically unsaturated bond;

c) 1 to 20 parts by weight of an alkali-soluble resin binder;

d) 10 to 95 parts by weight of a solvent; and e) 0.5 to 20 parts by weight of a colorant.

Further, when components other than the above-mentioned ones are added, it is preferred that the second photoactive compound is contained in the amount of 0.1 to 5 parts by weight and the other additives are contained in the amount of 0.01 to 5 parts by weight, respectively.

The photosensitive composition according to the present invention can be used in photocurable paints, photocurable inks, photocurable adhesives, photoresists for printing circuit boards, pigment dispersion type photoresists for manufacturing TFT LCD (thin film transistor liquid crystal display) color filters, photoresists for manufacturing black matrixes of TFT LCDs or organic light emitting diodes, etc., and there are no limits in its application.

The following preferred Examples are given by way of illustration to facilitate a better understanding of the present invention and are not intended to limit the present invention.

MODE FOR INVENTION

EXAMPLES 1 to 6

Preparation of Transparent Photosensitive Compositions

Example 1

8 g of an alkali-soluble resin binder, BzMA/MAA (molar ratio: 70/30, Mw: 24,000), 16 g of dipentaerythritol hexaacrylate as a polymerizable compound, 1 g of the compound (A) as represented in the following Table 1 as a photopolymerization initiator and 79 g of PGMEA as an organic solvent were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 2.5 μm.

The film was exposed to light through a circular isolated pattern photomask having a diameter of 30 μm under a high pressure mercury lamp, and the pattern was developed in an aqueous KOH alkali solution of pH 11.3 to 11.7, washed with deionized water, and postbaked at 200° C. for about 40 minutes. Then, the pattern conditions were observed with an optical microscope and a pattern profiler.

Example 2

A photosensitive composition was prepared in the same manner as in Example 1 except that 1 g of the compound (B) as represented in the following Table 1 was used instead of the compound (A) as represented in the following Table 1 as a photopolymerization initiator in Example 1.

Example 3

A photosensitive composition was prepared in the same manner as in Example 1 except that 1 g of the compound (C) as represented in the following Table 1 was used instead of the compound (A) as represented in the following Table 1 as a photopolymerization initiator in Example 1.

Example 4

A photosensitive composition was prepared in the same manner as in Example 1 except that 1 g of the compound (D) as represented in the following Table 1 was used instead of the compound (A) as represented in the following Table 1 as a photopolymerization initiator in Example 1

Example 5

A photosensitive composition was prepared in the same manner as in Example 1 except that 1 g of the compound (E) as represented in the following Table 1 was used instead of the compound (A) as represented in the following Table 1 as a photopolymerization initiator in Example 1.

Example 6

A photosensitive composition was prepared in the same manner as in Example 1 except that 1 g of the compound (F) as represented in the following Table 1 was used instead of the compound (A) as represented in the following Table 1 as a photopolymerization initiator in Example 1.

Comparative Example 1

A photosensitive composition was prepared in the same manner as in Example 1 except that 1 g of Irgacure 369 was used instead of the compound (A) as represented in the following Table 1 as a photopolymerization initiator in Example 1.

Comparative Example 2

A photosensitive composition was prepared in the same manner as in Example 2 except that 1 g of Irgacure 907 was used instead of the compound (B) as represented in the following Table 1 as a photopolymerization initiator in Example 2.

TABLE 1

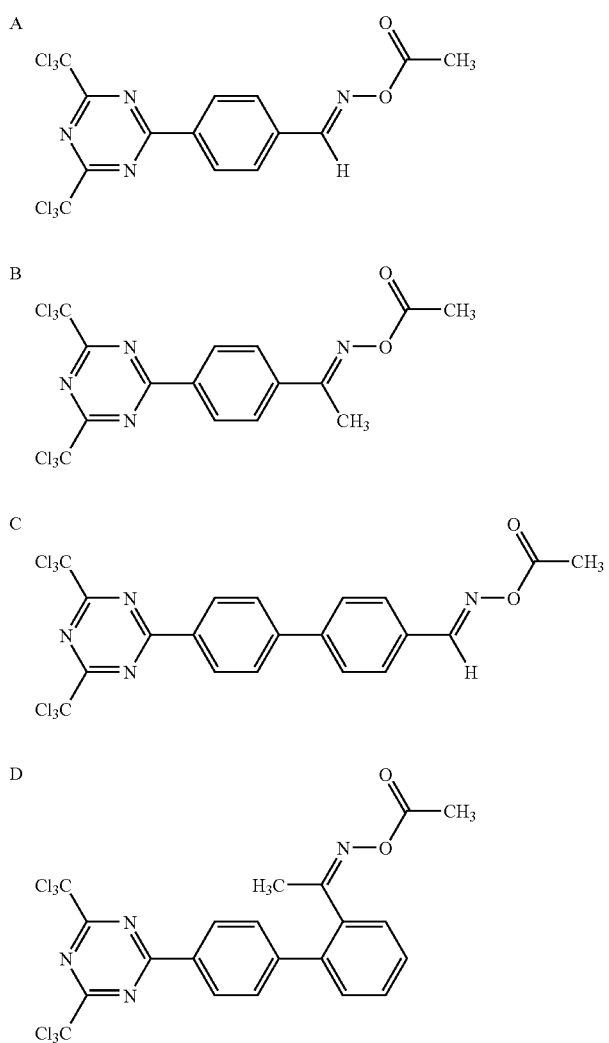

TABLE 1-continued

E
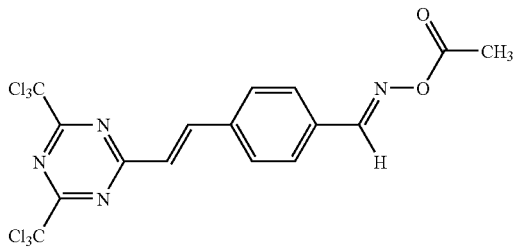

F
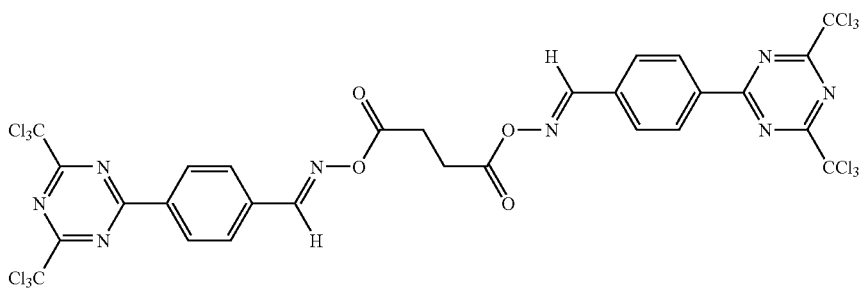

Experimental Example 1

Evaluation on Properties of Transparent Photosensitive Compositions According to the Present Invention Properties of transparent photosensitive compositions prepared in Examples 1 to 6 and Comparative Examples 1 to 2 were measured in the following method.

1. Photosensitivity

The sensitivity was defined as an exposure value at which the pattern thickness is no longer increased when exposed to light and the sensitivity was determined with changing the exposure value through a circular isolated pattern photomask having a diameter of 30 μm. It could be said that the less the exposure value the higher the sensitivity. The whole wavelength region light emitted from a high pressure mercury lamp as a light source was used without filtering out a specific wavelength of light and the exposure value was measured at 365 nm (i-line).

2. Retention Rate

The thickness difference was evaluated by measuring the thickness before and after postbaking.

Retention rate=[(film thickness after postbaking)/(film thickness before postbaking)]×100(%)

If the retention rate value is large, the post-process pollution sources due to the decomposed product of the photopolymerization initiator are reduced.

3. Mechanical Strength

The pattern was indented to 80 mN by the flat tip of a microhardness tester (trade name: H-100©, manufactured by Fischerscope) and then mechanical strength was evaluated based on the thickness changing rate.

Mechanical strength=[(thickness variation)/(film thickness before treatment)]×100(%)

If the thickness variation is small, mechanical strength can be said to be excellent.

4. Heat Resistance

The film was allowed to stand in an oven at 200° C. for 40 minutes and then heat resistance was evaluated based on the thickness changing rate.

Heat resistance=[(thickness variation))/(film thickness before treatment)]×100(%)

If the value is small, heat resistance can be said to be excellent.

5. Chemical Resistance

Chemical resistance was examined by immersing the pattern in NMP at 70° C. for 1 minute and then by observing the thickness changing rate.

Chemical resistance=[(thickness variation))/(film thickness before treatment)]×100(%)

If the thickness variation is small, it can be said to be an excellent transparent photosensitive composition.

6. Developing Durability

Developing durability was evaluated based on the minimum size of the isolated pattern remained after irradiation with energy of 150 mJ/cm² and development for 80 seconds. If the minimum size is small, developing durability can be said to be excellent.

The results were shown in Table 2.

TABLE 2

Properties of transparent photosensitive compositions according to the present invention

|  |  | sensitivity (mJ/cm²) | retention rate (%) | mechanical strength (%) | heat resistance (%) | chemical resistance (%) | developing durability (μm) |
|---|---|---|---|---|---|---|---|
| Ex. | 1 | 100 | 97 | 10 | 1.8 | 2.1 | 8 |
|  | 2 | 105 | 95 | 13 | 1.3 | 1.8 | 8 |
|  | 3 | 105 | 93 | 12 | 1.4 | 2.0 | 9 |
|  | 4 | 100 | 92 | 10 | 1.7 | 2.0 | 11 |
|  | 5 | 105 | 91 | 12 | 1.5 | 1.8 | 8 |
|  | 6 | 105 | 92 | 12 | 1.4 | 2.0 | 10 |
| Comp. Ex. | 1 | 210 | 89 | 14 | 2.1 | 2.8 | 14 |
|  | 2 | 250 | 73 | 18 | 4.5 | 3.4 | 17 |

As shown in Table 2, the transparent photosensitive composition according to the present invention was excellent in sensitivity, retention rate, mechanical strength, heat resistance, chemical resistance and developing durability, while the photosensitive composition prepared in Comparative Example was not good in sensitivity, retention rate, mechanical strength, heat resistance, chemical resistance and developing durability.

Therefore, it is shown that the transparent photosensitive composition according to the present invention is excellent in sensitivity, retention rate, mechanical strength, heat resistance, chemical resistance and developing durability by containing, as a photopolymerization initiator, a compound having an oxime ester group and a triazine group in one molecule.

Examples 7 to 12

Preparation of Colored Photosensitive Compositions

Example 7

50 g of a 15% dispersion of CI Pigment Red 254 (pigment: 7.5 g, dispersant: 2.5 g, PGMEA: 40 g), 6 g of an alkali-soluble resin binder, BzMA/MAA (molar ratio: 70/30, Mw: 24,000), 6 g of dipentaerythritol hexaacrylate as a polymerizable compound, 1 g of the compound (A) as represented in the following Table 1 as a photopolymerization initiator and 37 g of PGMEA as an organic solvent were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 2.2 μm.

The film was exposed to light through a line-and-space photomask under a high pressure mercury lamp, and the pattern was developed in an aqueous KOH alkali solution of pH 11.3 to 11.7, washed with deionized water, and postbaked at 200° C. for about 40 minutes. Then, the pattern conditions were observed with an optical microscope and a pattern profiler.

Example 8

50 g of a 15% dispersion of CI Pigment Green 36 (pigment: 7.5 g, dispersant: 2.5 g, PGMEA: 40 g), 10 g of a 15% dispersion of CI Pigment Yellow 150 (pigment: 1.5 g, dispersant: 0.5 g, PGMEA: 8 g), 4 g of an alkali-soluble resin binder, BzMA/MAA (molar ratio: 70/30, Mw: 24,000), 4 g of dipentaerythritol hexaacrylate as a polymerizable compound, 1.5 g of the compound (B) as represented in the following Table 1 as a photopolymerization initiator and 30.5 g of PGMEA as an organic solvent were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 2.2 μm.

The film was exposed to light through a line-and-space photomask under a high pressure mercury lamp, and the pattern was developed in an aqueous KOH alkali solution of pH 11.3 to 11.7, washed with deionized water, and postbaked at 200° C. for about 40 minutes. Then, the pattern conditions were observed with an optical microscope and a pattern profiler.

Example 9

40 g of a 15% dispersion of CI Pigment Blue 15:6 (pigment: 6 g, dispersant: 2 g, PGMEA: 32 g), 7 g of an alkali-soluble resin binder, BzMA/MAA (molar ratio: 70/30, Mw: 24,000), 7 g of dipentaerythritol hexaacrylate as a polymerizable compound, 1 g of the compound (C) as represented in the following Table 1 as a photopolymerization initiator and 45 g of PGMEA as an organic solvent were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 2.2 μm.

The film was exposed to light through a line-and-space photomask under a high pressure mercury lamp, and the pattern was developed in an aqueous KOH alkali solution of pH 11.3 to 11.7, washed with deionized water, and post baked at 200° C. for about 40 minutes. Then, the pattern conditions were observed with an optical microscope and a pattern profiler.

Example 10

40 g of a 20% dispersion of carbon black (carbon black: 8 g, dispersant: 2 g), 4 g of an alkali-soluble resin binder, BzMA/MAA (molar ratio: 80/20, Mw: 24,000), 3 g of dipentaerythritol hexaacrylate as a polymerizable compound and 2 g of the compound (D) as represented in the following Table 1 as a photopolymerization initiator were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 1.1 μm.

The film was exposed to light through a line-and-space photomask under a high pressure mercury lamp, and the pattern was developed in an aqueous KOH alkali solution of pH 11.3 to 11.7, washed with deionized water, and post baked at 200° C. for about 40 minutes. Then, the pattern conditions were observed with an optical microscope and a pattern profiler.

Example 11

40 g of a 20% dispersion of carbon black (carbon black: 8 g, dispersant: 2 g), 4 g of an alkali-soluble resin binder, BzMA/MAA (molar ratio: 80/20, Mw: 24,000), 3 g of dipentaerythritol hexaacrylate as a polymerizable compound and 2 g of the compound (E) as represented in the following Table 1 as a photopolymerization initiator were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 1.1 μm.

The film was exposed to light through a line-and-space photomask under a high pressure mercury lamp, and the pattern was developed in an aqueous KOH alkali solution of pH 11.3 to 11.7, washed with deionized water, and postbaked at 200° C. for about 40 minutes. Then, the pattern conditions were observed with an optical microscope and a pattern profiler.

Example 12

50 g of a 15% dispersion of CI Pigment Red 254 (pigment: 7.5 g, dispersant: 2.5 g, PGMEA: 40 g), 6 g of an alkali-soluble resin binder, BzMA/MAA (molar ratio: 70/30, Mw: 24,000), 6 g of dipentaerythritol hexaacrylate as a polymerizable compound, 1 g of the compound (F) as represented in the following Table 1 as a photopolymerization initiator and 37 g of PGMEA as an organic solvent were mixed using a shaker for 3 hours. Then, the resulting solution was filtered through a 5 micron filter and the photosensitive composition solution obtained was spin-coated onto glass and prebaked at about 100° C. for 2 minutes to form a uniform film having a thickness of about 2.2 μm.

The film was exposed to light through a line-and-space photomask under a high pressure mercury lamp, and the pattern was developed in an aqueous KOH alkali solution of pH 11.3 to 11.7, washed with deionized water, and postbaked at 200° C. for about 40 minutes. Then, the pattern conditions were observed with an optical microscope and a pattern profiler.

Comparative Example 3

A photosensitive composition was prepared in the same manner as in Example 6 except that 1 g of Irgacure 369 was used instead of the compound (A) as represented in the following Table 1 as a photopolymerization initiator in Example 7.

Comparative Example 4

A photosensitive composition was prepared in the same manner as in Example 8 except that 1.5 g of Irgacure 369 was used instead of the compound (B) as represented in the following Table 1 as a photopolymerization initiator in Example 8.

Comparative Example 5

A photosensitive composition was prepared in the same manner as in Example 9 except that 1 g of Irgacure 369 was used instead of the compound (C) as represented in the following Table 1 as a photopolymerization initiator in Example 9.

Comparative Example 6

A photosensitive composition was prepared in the same manner as in Example 10 except that 2 g of Irgacure 369 was used instead of the compound (D) as represented in the following Table 1 as a photopolymerization initiator in Example 10.

Experimental Example 2

Evaluation on Properties of Colored Photosensitive Compositions According to the Present Invention Properties of colored photosensitive compositions prepared in Examples 7 to 12 and Comparative Examples 3 to 6 were measured in the following method.

1. Photosensitivity

The sensitivity was defined as an exposure value at which the pattern having a thickness of 14 μm can be formed when exposed to light through a line-and-space photomask, and the sensitivity was determined with changing the exposure value. It could be said that the less the exposure value the higher the sensitivity. The whole wavelength region light emitted from a high pressure mercury lamp as a light source was used without filtering out a specific wavelength of light and the exposure value was measured at 365 nm (i-line).

2. Retention Rate

The thickness difference was evaluated by measuring the thickness before and after postbaking.

Retention rate=[(film thickness after postbaking)/(film thickness before postbaking)]×100(%)

If the retention rate value is large, the post-process pollution sources due to the decomposed product of the photopolymerization initiator are reduced.

3. Chemical Resistance

Chemical resistance was examined by immersing the pattern in NMP at 60° C. for 1 minute and then by observing the change in the chromatic coordinates. If the change in the chromatic coordinates (ΔEab*) is small, it can be said to be an excellent colored photosensitive composition.

4. Developing Durability

Developing durability was evaluated based on the minimum size of the isolated pattern remained after irradiation with energy of 100 mJ/cm² and development for 80 seconds. If the minimum size is small, developing durability can be said to be excellent.

The results were shown in Table 3.

TABLE 3

| | | sensitivity (mJ/cm²) | Retention Rate (%) | Chemical resistance (%) | Developing durability (μm) |
|---|---|---|---|---|---|
| Ex. | 7 | 60 | 92 | 2.4 | 14 |
| | 8 | 80 | 90 | 2.7 | 16 |
| | 9 | 60 | 94 | 1.9 | 14 |
| | 10 | 80 | 92 | — | 20 |
| | 11 | 80 | 92 | — | 16 |
| | 12 | 80 | 92 | 2.8 | 18 |
| Comp. Ex. | 3 | 100 | 83 | 8.5 | 20 |
| | 4 | 150 | 78 | 8.7 | 28 |
| | 5 | 120 | 83 | 7 | 20 |
| | 6 | 200 | 76 | — | 32 |

As shown in Table 3, the colored photosensitive composition according to the present invention was excellent in sensitivity, retention rate, chemical resistance and developing durability, while the colored photosensitive composition prepared in Comparative Example was not good in sensitivity, retention rate, chemical resistance and developing durability.

Therefore, it is shown that the colored photosensitive composition according to the present invention is excellent in sensitivity, retention rate, chemical resistance and developing durability by containing, as a photopolymerization initiator, a compound having an oxime ester group and a triazine group in one molecule.

The invention claimed is:

1. A photosensitive composition comprising:
   a) a triazine-based photoactive compound containing oxime ester represented by the following formula (1);
   b) a polymerizable compound having an ethylenically unsaturated bond,
   c) an alkali-soluble resin binder; and
   d) a solvent.

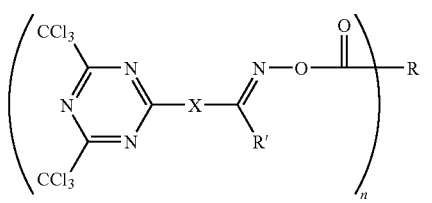

(1)

wherein n is an integer of 1 or 2;

when n=1, R is selected from the group consisting of a $C_1$ to $C_6$ alkyl group, a $C_1$ to $C_6$ haloalkyl group, a $C_1$ to $C_6$ alkyl group substituted with at least one group selected from the group consisting of $NL_2$, OL and SL wherein L is a hydrogen atom or $C_1$ to $C_6$ alkyl group, a phenyl group unsubstituted or substituted with at least one group selected from the group consisting of a $C_1$ to $C_6$ alkyl group, a halogen atom, a nitrile group, OH and COOH, and a $C_2$ to $C_5$ alkylcarboxyl group;

when n=2, R is selected from the group consisting of a $C_2$ to $C_6$ alkylene group, a 1,2-phenylene group, a 1,3-phenylene group, a 1,4-phenylene group,

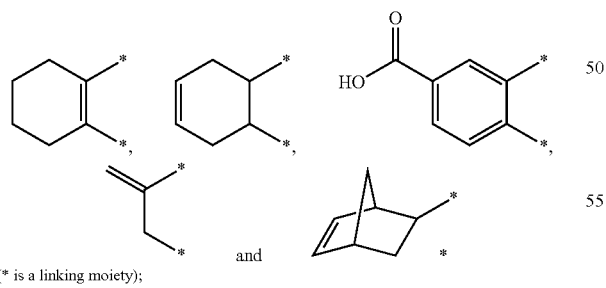

(* is a linking moiety);

R' is selected from the group consisting of a hydrogen atom, a $C_1$ to $C_6$ alkyl group, a nitrile group and a phenyl group;

X is a $C_5$ to $C_{20}$ arylene group unsubstituted or substituted with at least one group selected from the group consisting of a halogen atom, CN, a $C_1$ to $C_6$ alkyl group, a $C_1$ to $C_6$ alkoxy group, a $C_1$ to $C_6$ alkylthio group and a morpholino group; a divalent $C_4$ to $C_{20}$ heterocyclic group containing O, N or S, unsubstituted or substituted with at least one group selected from the group consisting of a halogen atom, CN, a $C_1$ to $C_6$ alkyl group, a $C_1$ to $C_6$ alkoxy group, a $C_1$ to $C_6$ alkylthio group and a morpholino group; or a compound of the following formula (2):

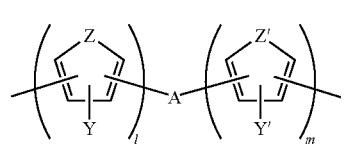

(2)

wherein Z and Z' are each independently one selected from the group consisting of $CH_2$, O, S, NR" wherein R" is a hydrogen atom or $C_1$ to $C_6$ alkyl group, and CH=CH;

l and m are an integer of 0 to 2, provided that l+m is not 0;

A is a simple linkage, or one selected from the group consisting of $C_pH_{2p}$, $O(CH_2O)_p$, CH=CH, NR''', S, O, S=O, $SO_2$, and C=O wherein p is an integer of 1 to 6 and R''' is a hydrogen atom or $C_1$ to $C_6$ alkyl group, provided that A is not a simple linkage when l+m=1; and Y and Y' are each optionally selected from the group consisting of a hydrogen atom, a halogen atom, CN, a $C_1$ to $C_6$ alkyl group, a $C_1$ to $C_6$ alkoxy group, a $C_1$ to $C_6$ alkylthio group and a morpholino group.

2. The photosensitive composition according to claim 1, wherein the triazine-based photoactive compound containing oxime ester represented by the formula (1) is a compound that when n=1, R is a methyl group or a phenyl group;

when n=2, R is an ethylene group or a tetrahydrophthalene group;

R' is a hydrogen atom, a methyl group or a phenyl group; and

X is selected from the group consisting of a phenylene group, a biphenylene group, a styrylene group and the following structural formulae:

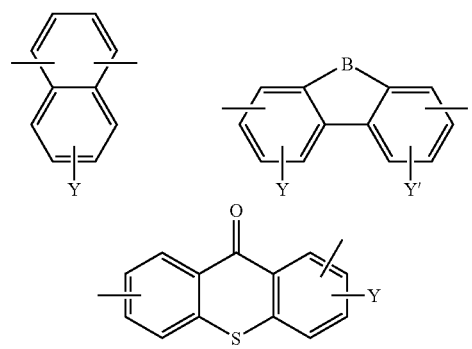

wherein B is one selected from the group consisting of $CH_2$, O, S, NR" wherein R" is a hydrogen atom or $C_1$ to $C_6$ alkyl group, and CH=CH; and Y and Y' are each optionally selected from the group consisting of a hydrogen atom, a halogen atom, CN, a $C_1$ to $C_6$ alkyl group, a $C_1$ to $C_6$ alkoxy group, a $C_1$ to $C_6$ alkylthio group and a morpholino group.

3. The photosensitive composition according to claim 1, wherein the compound of the formula (1) is one compound selected from the group consisting of the following structural formulae:
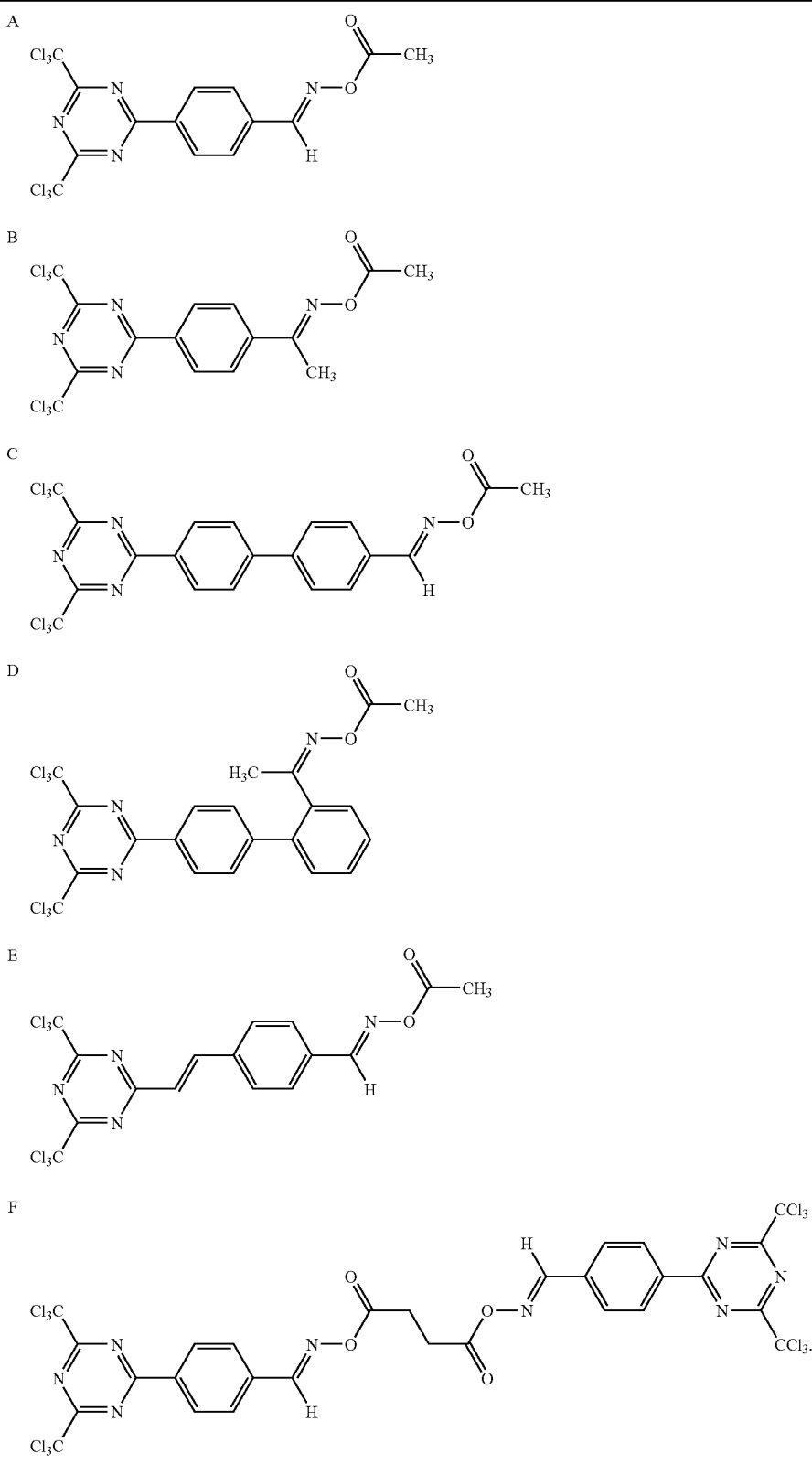

4. The photosensitive composition according to claim 1, which comprises
   a) 0.1 to 5 parts by weight of a triazine-based photoactive compound containing oxime ester represented by the formula (1);
   b) 0.5 to 20 parts by weight of a polymerizable compound having an ethylenically unsaturated bond;
   c) 1 to 20 parts by weight of an alkali-soluble resin binder; and
   d) 10 to 95 parts by weight of a solvent.

5. The photosensitive composition according to claim 1, wherein the photosensitive composition further comprises at least one selected from a second photoactive compound, a curing accelerator, a thermal polymerization inhibitor, a plasticizer, an adhesion accelerator, a filler and a surfactant.

6. The photosensitive composition according to claim 5, wherein the second photoactive compound is contained in the amount of 0.1 to 5 parts by weight.

7. The photosensitive composition according to claim 5, wherein the curing accelerator, the thermal polymerization inhibitor, the plasticizer, the adhesion accelerator, the filler and the surfactant are contained in the amount of 0.01 to 5 parts by weight, respectively.

8. The colored photosensitive composition according to claim 1, which further comprises e) a colorant.

9. The colored photosensitive composition according to claim 8, wherein the triazine-based photoactive compound containing oxime ester represented by the formula (1) is a compound that
   when n=1, R is a methyl group or a phenyl group;
   when n=2, R is an ethylene group or a tetrahydrophthalene group;

R' is a hydrogen atom, a methyl group or a phenyl group; and

X is selected from the group consisting of a phenylene group, a biphenylene group, a styrylene group and the following structural formulae:

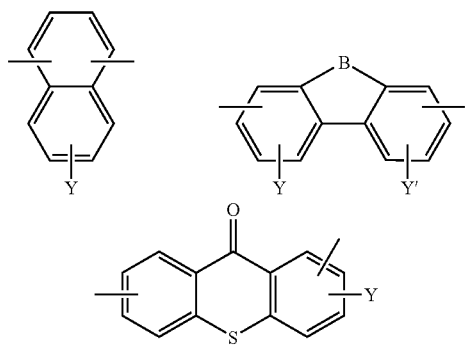

wherein B is one selected from the group consisting of $CH_2$, O, S, NR" wherein R" is a hydrogen atom or $C_1$ to $C_6$ alkyl group, and CH=CH; and Y and Y' are each optionally selected from the group consisting of a hydrogen atom, a halogen atom, CN, a $C_1$ to $C_6$ alkyl group, a $C_1$ to $C_6$ alkoxy group, a $C_1$ to $C_6$ alkylthio group and a morpholino group.

10. The colored photosensitive composition according to claim 8, wherein the compound of the formula (1) is a compound selected from the group consisting of the following structural formulae:

A
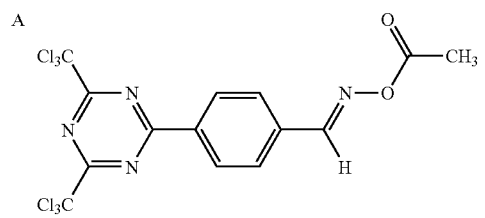

B
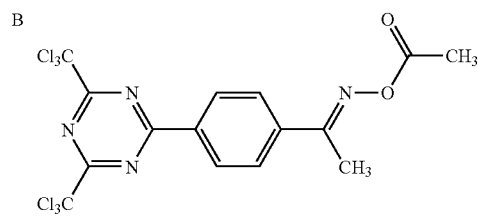

C
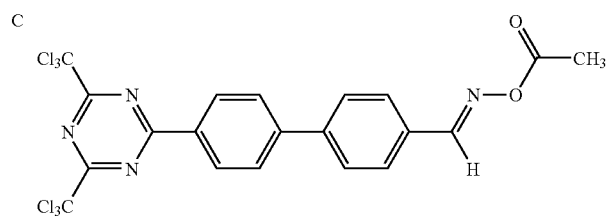

-continued

D
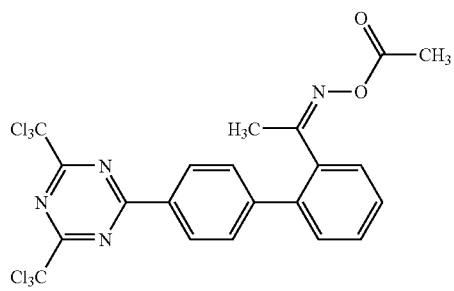

E
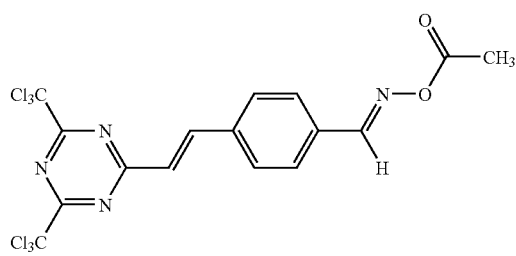

F
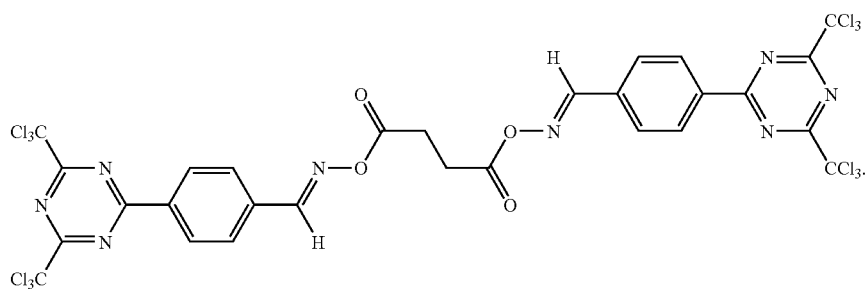

11. The colored photosensitive composition according to claim 8, which comprises
  a) 0.1 to 5 parts by weight of a triazine-based photoactive compound containing oxime ester represented by the formula (1);
  b) 0.5 to 20 parts by weight of a polymerizable compound having an ethylenically unsaturated bond;
  c) 1 to 20 parts by weight of an alkali-soluble resin binder;
  d) 10 to 95 parts by weight of a solvent; and
  e) 0.5 to 20 parts by weight of a colorant.

12. The colored photosensitive composition according to claim 8, wherein the colored photosensitive composition further comprises at least one selected from a second photoactive compound, a curing accelerator, a thermal polymerization inhibitor, a plasticizer, an adhesion accelerator, a filler and a surfactant.

13. The colored photosensitive composition according to claim 12, wherein the second photoactive compound is contained in the amount of 0.1 to 5 parts by weight.

14. The colored photosensitive composition according to claim 12, wherein the curing accelerator, the thermal polymerization inhibitor, the plasticizer, the adhesion accelerator, the filler and the surfactant are contained in the amount of 0.01 to 5 parts by weight, respectively.

* * * * *